(12) United States Patent
Rieve et al.

(10) Patent No.: US 7,326,589 B2
(45) Date of Patent: Feb. 5, 2008

(54) METHOD FOR PRODUCING A TFA IMAGE SENSOR AND ONE SUCH TFA IMAGE SENSOR

(75) Inventors: Peter Rieve, Windeck-Dattenfeld (DE); Konstantin Seibel, Siegen (DE); Jens Prima, Gehrde (DE); Markus Scholz, Kreuztal Krombach (DE); Tarek Lule, Saint Egreve (FR); Stephan Benthien, Saint Ismier (FR); Michael Sommer, Av. Alscae-Lorraine (FR); Michael Wagner, Bretnig-Hauswalde (DE)

(73) Assignee: STMicroelectronics N.V., Amsterdam (NL)

( * ) Notice: Subject to any disclaimer, the term of this patent is extended or adjusted under 35 U.S.C. 154(b) by 175 days.

(21) Appl. No.: 11/271,492

(22) Filed: Nov. 11, 2005

(65) Prior Publication Data

US 2006/0102829 A1    May 18, 2006

Related U.S. Application Data

(63) Continuation of application No. 11/082,399, filed on Mar. 10, 2005, now abandoned, which is a continuation of application No. 10/493,756, filed as application No. PCT/DE02/03964 on Oct. 21, 2002, now abandoned.

(30) Foreign Application Priority Data

Oct. 26, 2001    (DE) ................. 101 52 3254

(51) Int. Cl.
*H01L 21/00*    (2006.01)
(52) U.S. Cl. .............. 438/57; 438/384; 438/199; 257/49; 257/444
(58) Field of Classification Search ............ 438/57; 257/44, 49
See application file for complete search history.

(56) References Cited

U.S. PATENT DOCUMENTS 3,971,065 A    7/1976 Bayer (Continued)

FOREIGN PATENT DOCUMENTS

EP    1113499 A2    7/2001
WO    WO 02/50921 A1    2/2002

OTHER PUBLICATIONS

International Search Report from International application No. PCT/DE02/03964, filed Oct. 10, 2002.

(Continued)

*Primary Examiner*—Michael Lebentritt
*Assistant Examiner*—Abdulfattah Mustapha
(74) *Attorney, Agent, or Firm*—Lisa K. Jorgenson; James H. Morris; Wolf, Greenfield & Sacks, P.C

(57) ABSTRACT

The invention relates to a method for producing a TFA image sensor in which a multi-layer arrangement comprising a photo diode matrix is arranged on an ASIC switching circuit provided with electronic circuits for operating the TFA image sensor, such as pixel electronics, peripheral electronics and system electronics, for the pixel-wise conversion of electromagnetic radiation into an intensity-dependent photocurrent, the pixels being connected to contacts of the underlying pixel electronics of the ASIC switching circuit. The method enables conventionally produced ASIC switching circuits to be used without impairing the topography of the photoactive sensor surface. The CMOS passivation layer in the photoactive region and then the upper CMOS metallization are removed and replaced by a metallic layer which is structured in the pixel raster, for the formation of back electrodes. The photo diode matrix is then applied and structured, said photo diode matrix being embodied as a pixel matrix, on which a passivating protective layer and/or a color filter layer having a passivating action can be applied.

11 Claims, 7 Drawing Sheets

12

U.S. PATENT DOCUMENTS

| | | | |
|---|---|---|---|
| 4,285,007 | A | 8/1981 | Nakano et al. |
| 6,111,247 | A | 8/2000 | Sengupta |
| 6,373,117 | B1 * | 4/2002 | Theil .......................... 257/444 |
| 6,586,812 | B1 * | 7/2003 | Cao et al. ................... 257/443 |

OTHER PUBLICATIONS

International Search Report from International application No. PCT/DE02/04008, filed Oct. 24, 2002.

Schneider et al., *Image Sensors In TFA (Thin Film on ASIC) Technology*, Handbook of Computer Vision and Applications pp. 237 to 270, Academic Press, San Diego, 1999.

P. Rieve et al., *a-Si:H Color Imagers and Colorimetry*, Journal of Non-Crystalline Solids, vol. 266 to 269, pp. 1168 to 1172, (2000).

Schulte et al., *Intelligent Image Sensor For On-Chip Contour Extraction*, Proceedings of the SPIE, SPIE, Bellingham, VA, vol. 2247, Jun. 22, 1994, pp. 292-300, XP002080272.

Theil et al., *Hydrogenated Amorphous Silicon Photodiode Technology for Advanced CMOS Active Pixel Sensor Imagers*, Mat. Res. Soc. Symp. vol. 609, 2000 Materials Research Society pp. A14.31-A14.36.

* cited by examiner

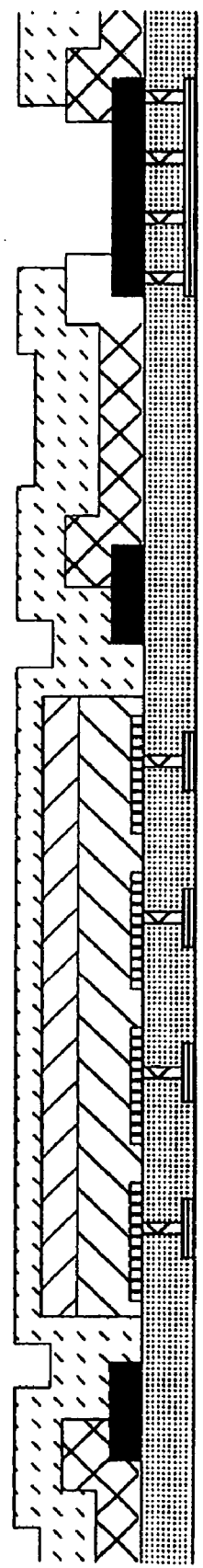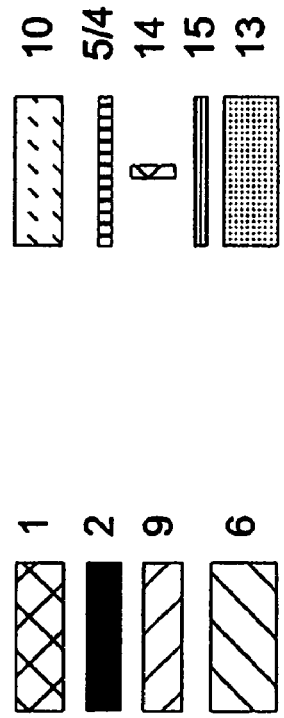
Fig. 6

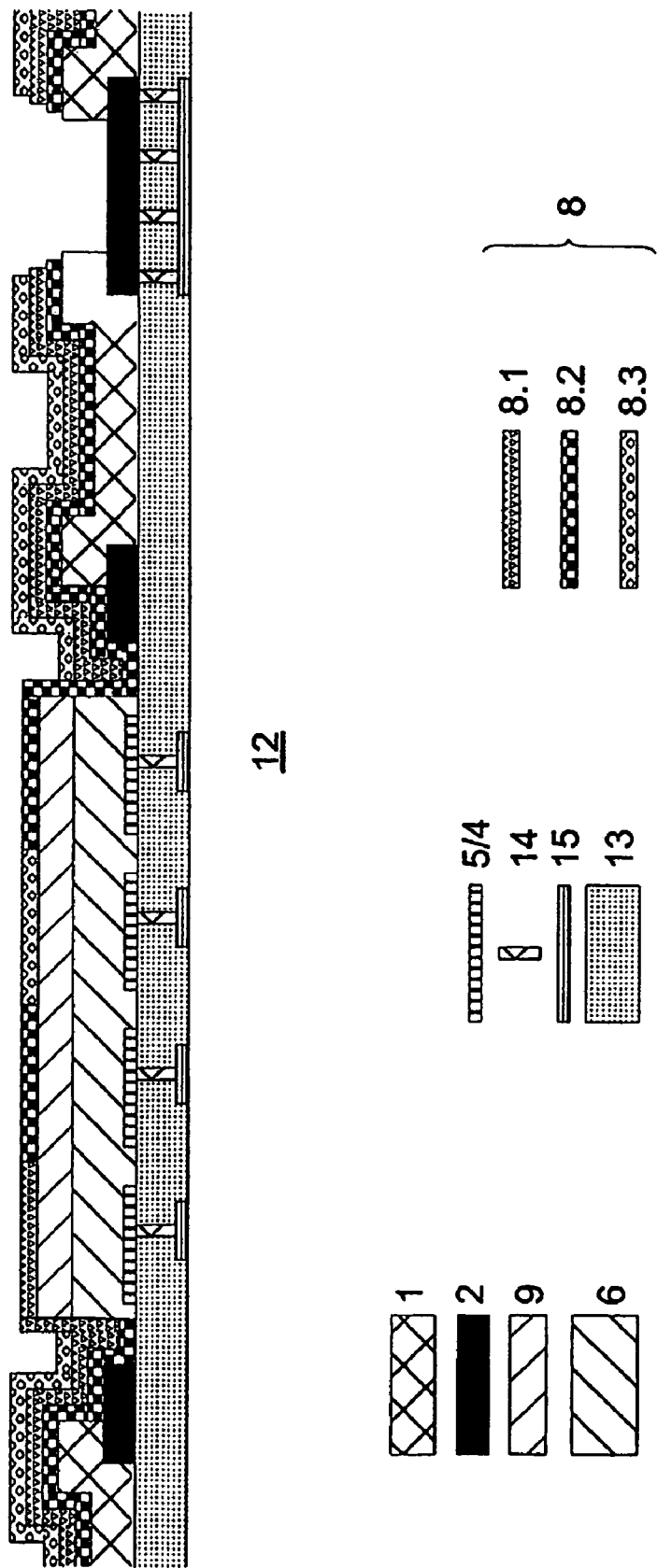

METHOD FOR PRODUCING A TFA IMAGE SENSOR AND ONE SUCH TFA IMAGE SENSOR

CROSS REFERENCE TO RELATED APPLICATIONS

This application is a continuation of U.S. application Ser. No. 11/082,399, filed Mar. 10, 2005 now abandoned which is a continuation of U.S. application Ser. No. 10/493,756, filed Mar. 26, 2004 now abandoned entitled Method For Producing. A Tfa Image Sensor And One Such Tfa Image Sensor, which applications are incorporated herein by reference in their entirety.

FIELD OF THE INVENTION

The invention relates to a method for producing a TFA image sensor in which a multi-layer arrangement of adjacent photodiodes is arranged on an ASIC provided with electronic circuits for operating the TFA image sensor, such as pixel electronics, peripheral electronics and system electronics, for the pixel-wise conversion of electromagnetic radiation into an intensity-dependent photocurrent, wherein the pixels are connected to contacts of the underlying pixel electronics. The invention further relates to a TFA image sensor.

DISCUSSION OF THE RELATED ART

Image sensors are optoelectronic components for converting electromagnetic radiation into an intensity-dependent photocurrent in conjunction with an optical sensor using thin film on ASIC (TFA) technology, i.e., a thin-film technology on an application-specific integrated circuit (ASIC). Such a TFA image sensor consists of a matrix-organized or linear arrangement of image points (pixels). The electronic circuits for operating the sensor (e.g., pixel electronics, peripheral electronics, system electronics) are usually realized in CMOS-based silicon technology, and comprise the ASIC circuit.

Separated from it by an isolating layer and connected with it by corresponding electrical contacts, the ASIC circuit accommodates a multi-layer arrangement with a photodiode matrix, which converts electromagnetic radiation into an intensity-dependent photocurrent. This photocurrent is transferred to specific contacts in each pixel of the underlying pixel electronics of the ASIC circuit (B. Schneider, P. Rieve, M. Bohm, Image Sensors in TFA (Thin Film on ASIC) Technology, ed. B. Jähne, H. Hausecker, P. Geißler, Handbook of Computer Vision and Applications, pp. 237-270, Academic Press, San Diego, 1999).

According to prior art, the photodiode is applied to a flat ASIC circuit, as disclosed in DE 100 63 837.6 (German patent application: TFA Image Sensor with Extremely Low Dark Current). The photodiode can be designed as a Schottky diode or pin diode, or even assume the form of other diode structures, e.g., with a controllable spectral sensitivity (P. Rieve, M. Sommer, M. Wagner, K. Seibel, M. Böhm, a-Si:H Color Imagers and Colorimetry, Journal of Non-Crystalline Solids, vol. 266-269, pp. 1168-1172, 2000), and be made out of amorphous or microcrystalline silicon or its alloys. The fact that the photodiode matrix is located on a substrate having a flat topography in comparison to the diode thickness is crucial for a low dark current, and hence to ensure that the image sensor will function even at low illumination intensities. This means that the TFA image sensors according to prior art must do without passivation of the ASIC, which is generally no longer made planar and, in conjunction with the uppermost metal layer lying under it, results in a topography characterized by gradations exceeding 2 μm, and hence can no longer be viewed as flat.

By contrast, it makes a lot of sense to passivate the image sensor in order to shield the sensor against environmental influences (e.g., moisture penetration) and mechanical stress during the processing steps yet to be implemented and beyond, and also for purposes of reliability.

SUMMARY OF THE INVENTION

The object of the invention is thus to provide a method for producing a TFA image sensor that enables the use of conventionally produced, passivated ASIC circuits without impairing the topography of the photoactive sensor surface. In addition, an improved TFA image sensor is to be fabricated.

The object of the invention is achieved in a method of the kind mentioned at the outset by virtue of the fact that the CMOS passivation layer in the photoactive region and then the uppermost CMOS metallization is removed and replaced by a metal layer, which is structured in the pixel raster, for the formation of back electrodes and then subsequently the multilayer arrangement of a photodiode, wherein the photodiode matrix is designed as a pixel matrix.

This method ensures a completely planar surface in the area of the pixel matrix as a precondition for a good functionality of the TFA image sensor with low dark current.

The metal layer structured in the pixel raster can advantageously be fabricated by depositing chromium.

It also makes sense to apply a passivating protective layer at least to the photodiode matrix, wherein the bond pads are kept open or subsequently exposed. However, this protective layer should exhibit a high transparency in the relevant spectral region.

To ensure that the edge region of the photodiode matrix is also well protected, it is advantageous for the passivating protective layer to also cover this region.

In order not to impair the underlying structures, the protective layer should be applied in a low-temperature process, e.g., at a temperature of approx. 200° C.

Benzocyclobutene (BCB) based polymer dielectrics (cyclotenes), parylene (a clear polymer) or another suitable polymeric transparent material that is sufficiently moisture resistant are suitable for the protective layer.

It is also advantageous to apply a color filter layer with passivating action at least to the photodiode matrix to adjust the properties of the TFA image sensor to other color image sensors, for which a mosaic-structured color filter layer is also suitable.

Of course, it is also possible to stack several color filter layers one on top of the other.

In a TFA image sensor comprised of an ASIC circuit that accommodates a multilayer arrangement with adjacent photodiodes for the pixel-wise conversion of electromagnetic radiation into an intensity-dependent photocurrent, wherein the pixels are connected with contacts of the underlying pixel electronics, the object of the invention is further achieved by arranging a photodiode matrix with back contacts in the photoactive region directly on the surface of the ASIC, and covering the photodiode matrix including the peripheral electronics located on the ASIC with a transparent protective layer, wherein the bond pads are recessed on the ASIC circuit.

In a first embodiment, a mosaic-structured multicolor filter layer covers at least the area of the photodiode matrix as the protective layer.

To achieve a special filtering effect, e.g., an adjustment to the properties of other color image sensors, several filer layers are stacked one on top of the other over the photodiode matrix in another embodiment of the invention.

In another embodiment of the invention, the protective and/or filter layer covers the periphery of the TFA image sensor, including the switching components located in this area, which provides these areas with a light screen, so that disturbing photodiode effects can be avoided.

The advantage to the method and the TFA image sensor produced with the method lies in the fact that the conventionally prepared CMOS passivation layer can be used without impairing the topography over the photoactive sensor surface as a result.

Selectively removing the CMOS passivating layer according to the method then exposes the uppermost CMOS metallization layer in this region. Since this metal layer is generally required as an etching stop for removing the passivation layer, the uppermost metal layer must lie flat under the mentioned passivation opening in the area of the photoactive sensor surface, and cannot be structured in the pixel raster as in the configuration described in prior art. In other words, the back electrodes of all image points are first interconnected via the uppermost CMOS metal layer, so that, before the photodiodes are applied, this uppermost CMOS metallization of the ASIC circuit must be removed and replaced by a matrix structured in the pixel raster and comprised of metal electrodes which form the back electrodes of the image points. This can be done either by completely removing the metal layer (including any conductive barrier layers) and then applying and structuring a new metal layer (e.g., chromium), or by only partially removing the uppermost CMOS metallization and structuring the remaining portion (e.g., the lower barrier layer). Similarly to the standard process, this is followed by the deposition of the photodiodes and, if necessary, additional layers (e.g., local light screening, color filter matrix).

BRIEF DESCRIPTION OF THE DRAWINGS

The invention will be described in greater detail below based on an exemplary embodiment. The accompanying drawings show:

FIG. 6: The TFA image sensor according to FIG. 5 with additional passivating transparent polymer layer; and FIG. 7: The TFA image sensor according to FIG. 5 with additional color filter layers for passivation.

DETAILED DESCRIPTION

Figure 1:
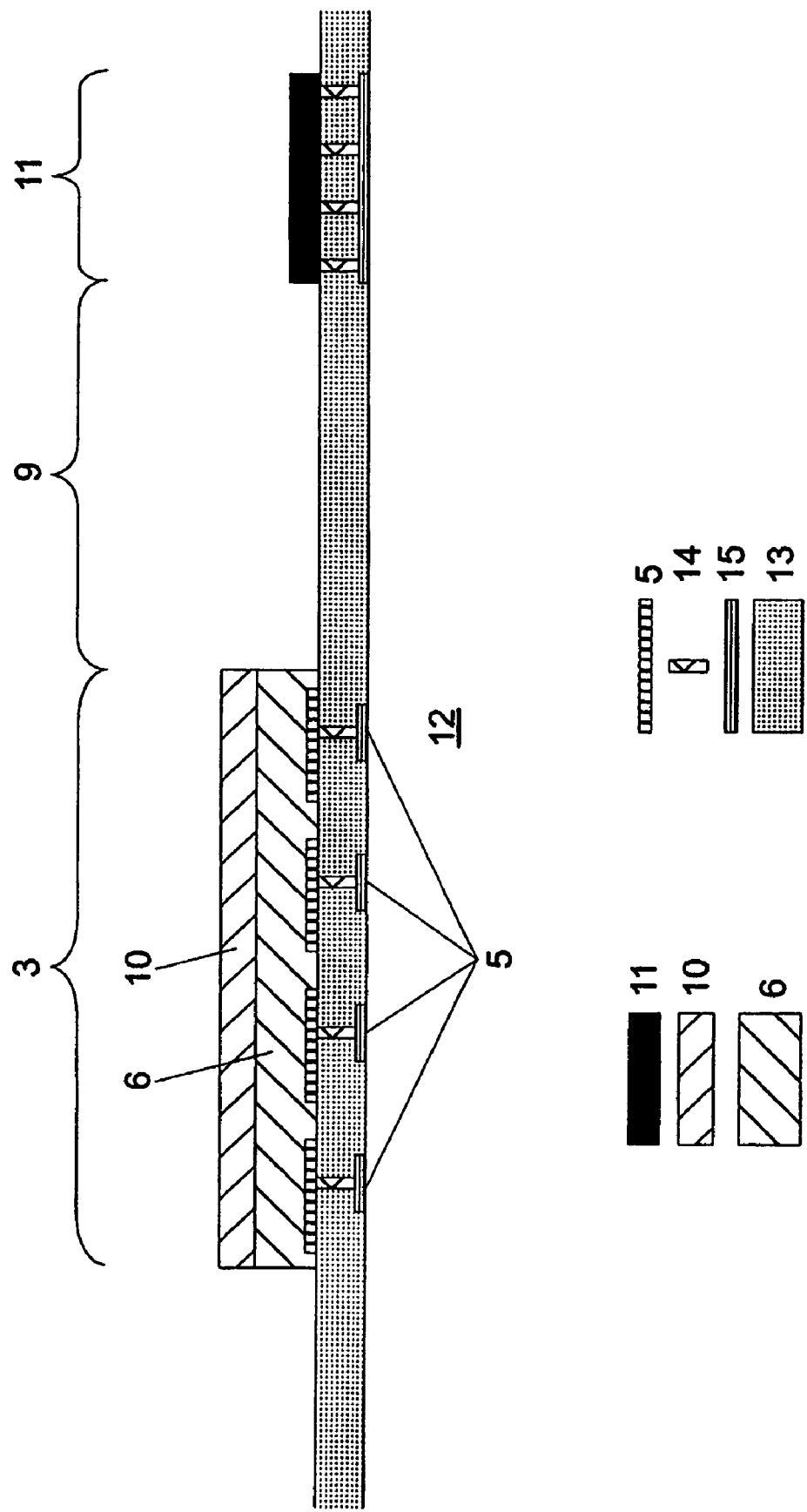
FIG. 1: A TFA image sensor produced according to prior art.

The procedural steps illustrated in FIG. 2 to 7 have been summarized in checklist form below:

1. Open the CMOS passivation layer 1 in the photoactive region.

2. Completely or partially remove the uppermost CMOS metallization 2 in the photoactive region 3.

3. If necessary, apply a new metal layer 4 (e.g., chromium).

4. Structure the metal layer 4 (formation of back electrodes 5).

5. Deposit and structure the photodiode matrix 6.

6. If necessary, deposit and structure a light-screening layer 7.

7. If necessary, deposit and structure color filter layers 8.

This ensures a planar surface in the area of the active photodiode matrix 6 of the TFA sensor, while the CMOS passivation layer 1 simultaneously protects the accompanying peripheral electronics 9 against environmental influences and mechanical stress. The metal layer 4 can consist of chromium or another suitable metal.

One advantageous further development of the TFA image sensor according to the invention involves the use of another passivating protective layer 10, which, in addition to the peripheral electronics 9, covers primarily the photodiode matrix 6 of the image sensor and passivates it against environmental influences. It can also be used in particular to protect the edge of the photodiode matrix 6 against environmental influences (e.g., penetrating moisture, which can increase the dark current).

This additional passivating protective layer 10 should exhibit a high transparency in the relevant spectral region, and lend itself to application in a low-temperature process (e.g., up to approx. 200° C. for amorphous silicon) so as not to impair the underlying structures. BCBs (cyclotenes), parylene or other polymeric transparent layers are suitable for this purpose. This passivating protective layer 10 must be structured in such a way as to expose only the bond pads 11 located in the area of the peripheral electronics 9.

In another advantageous embodiment of a TFA image sensor according to the invention, the mosaic-structured color filter layers 8 normally used in color image sensors (e.g., Bayer pattern, U.S. Pat. No. 3,971,065), which also exert a passivating protective effect over the photodiode matrix 6, are also provided at the edge of the photodiode matrix 6 and in the area of the peripheral electronics 9 of the image sensor. For example, several color filter layers 8 can be stacked one on top of the other, thereby enabling a light screening of the switching components located in this area in addition to the passivation of peripheral electronics 9.

The drawings shown on FIG. 2-7 here only show the uppermost layers of the ASIC circuit 12 of relevance for the interface to the TFA layers of the TFA image sensor.

FIG. 1 shows a cross section of a TFA image sensor according to prior art, i.e., without a passivation layer. The uppermost layer of the ASIC circuit 12 consists of an intermediate metal dielectric 13, through which vias 14 extend in the pixel raster and connect the back electrodes 5 (metal 3) of the photodiode matrix 6 located on the ASIC circuit 12 with the contacts 15 (metal 1) of the ASIC circuit 12. The photodiode matrix 6 is covered by the protective layer 10. The peripheral electronics 9 required for operating the TFA image sensor are only shown diagrammatically. In addition, FIG. 1 shows one of numerous bond pads 11 (metal 2) in the peripheral region of the TFA image sensor for realizing external contacts. The bond pad 11 is connected with another contact 16 of the ASIC circuit through the intermediate metal dielectric 13 by means of vias.

Figure 2:
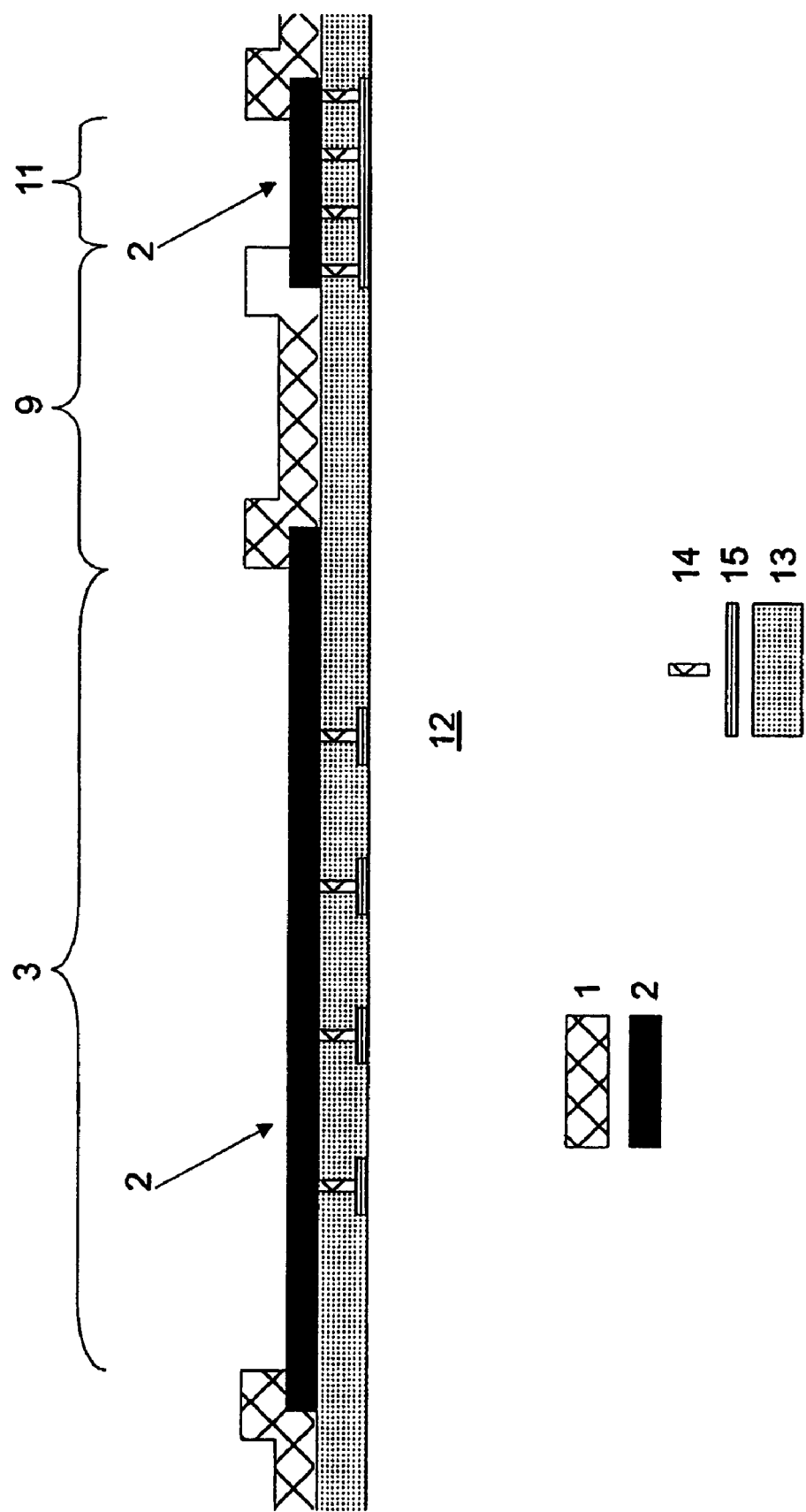
FIG. 2: A TFA image sensor according to the invention after opening the CMOS passivation layer.
Figure 3:
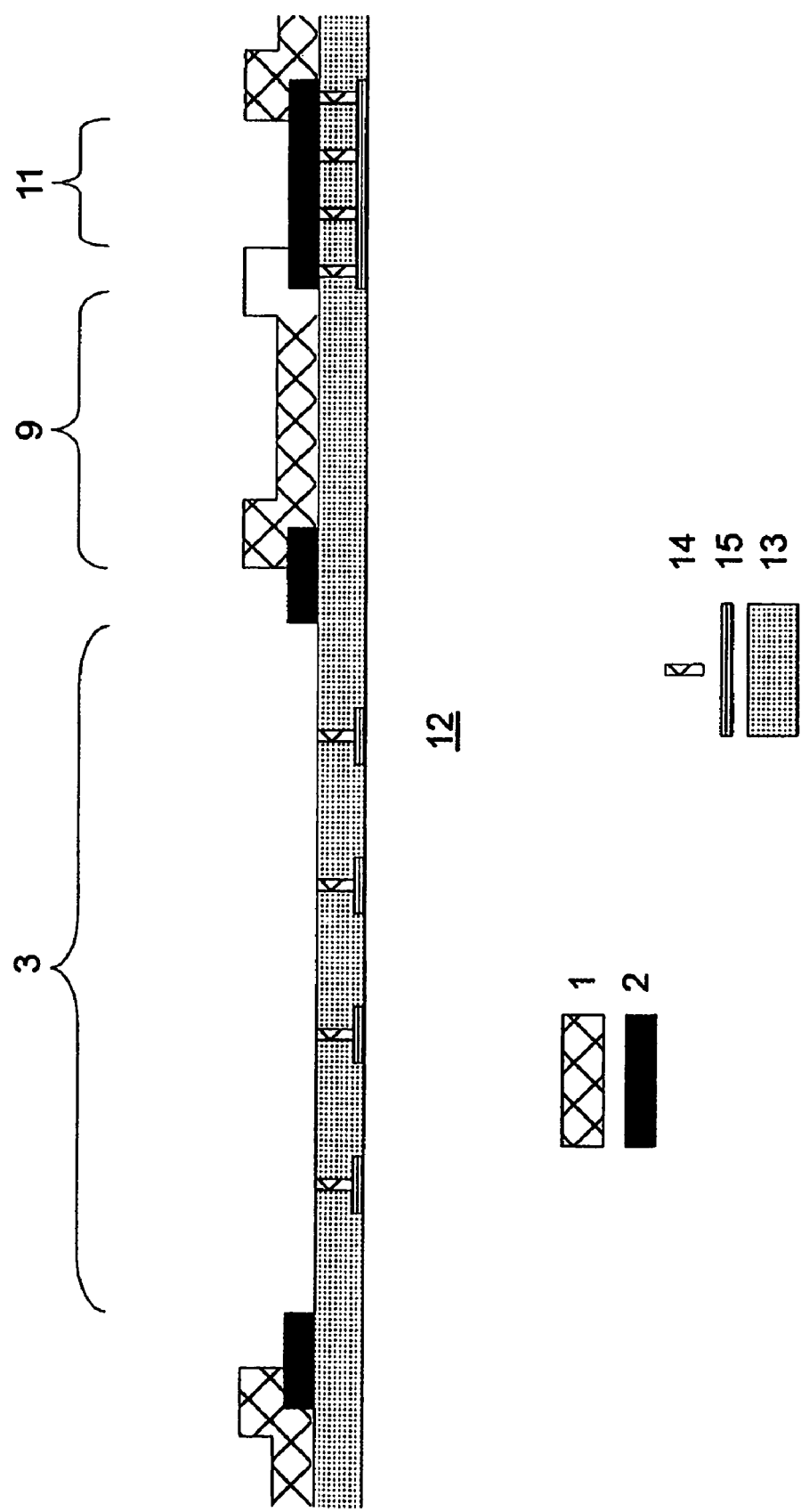
FIG. 3: The TFA image sensor according to FIG. 2 after back-etching the uppermost CMOS metallization.
Figure 4:
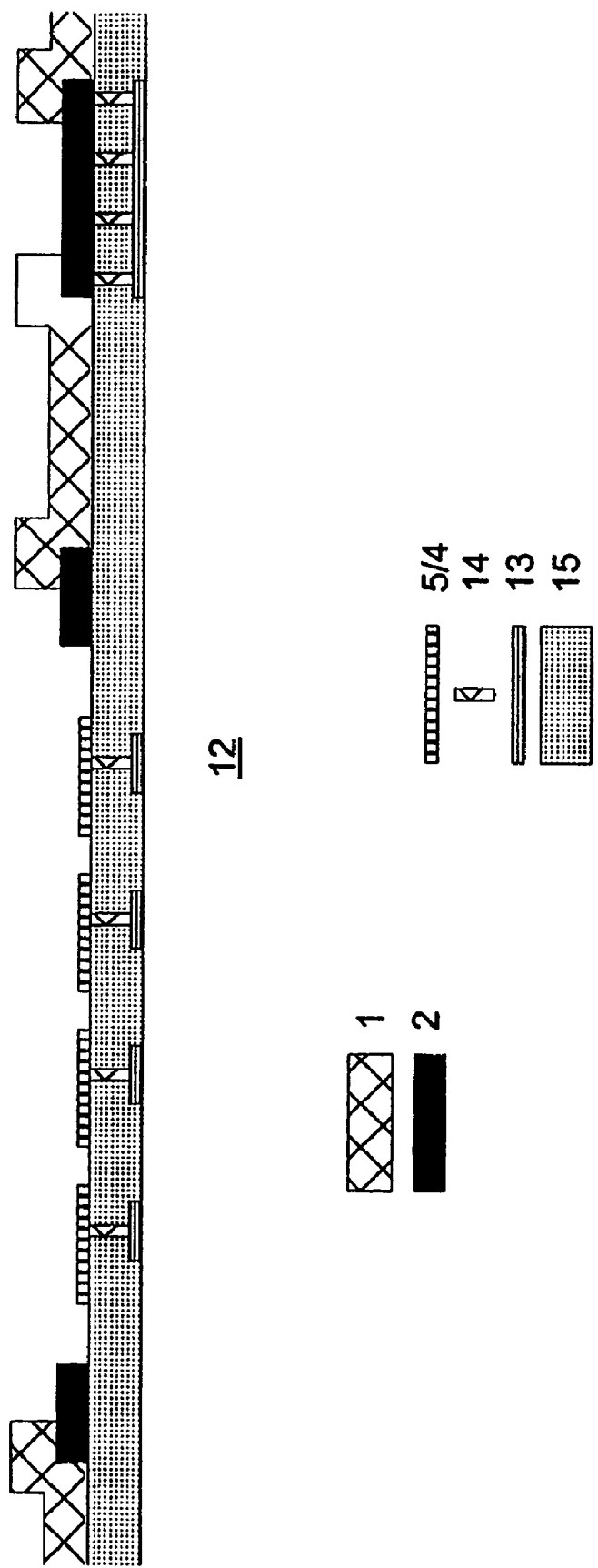
FIG. 4: The TFA image sensor after applying the back electrodes of the photodiodes.

FIG. 2 shows an image sensor according to the invention after opening the CMOS passivation layer 1 (procedural step 1 per above list), FIG. 3 after back-etching the uppermost CMOS metallization 2 (metal 2, procedural step 2), FIG. 4 after applying and structuring the back electrodes 5 (metal 3) of the photodiode matrix 6 (after procedural step 4).

Figure 5:
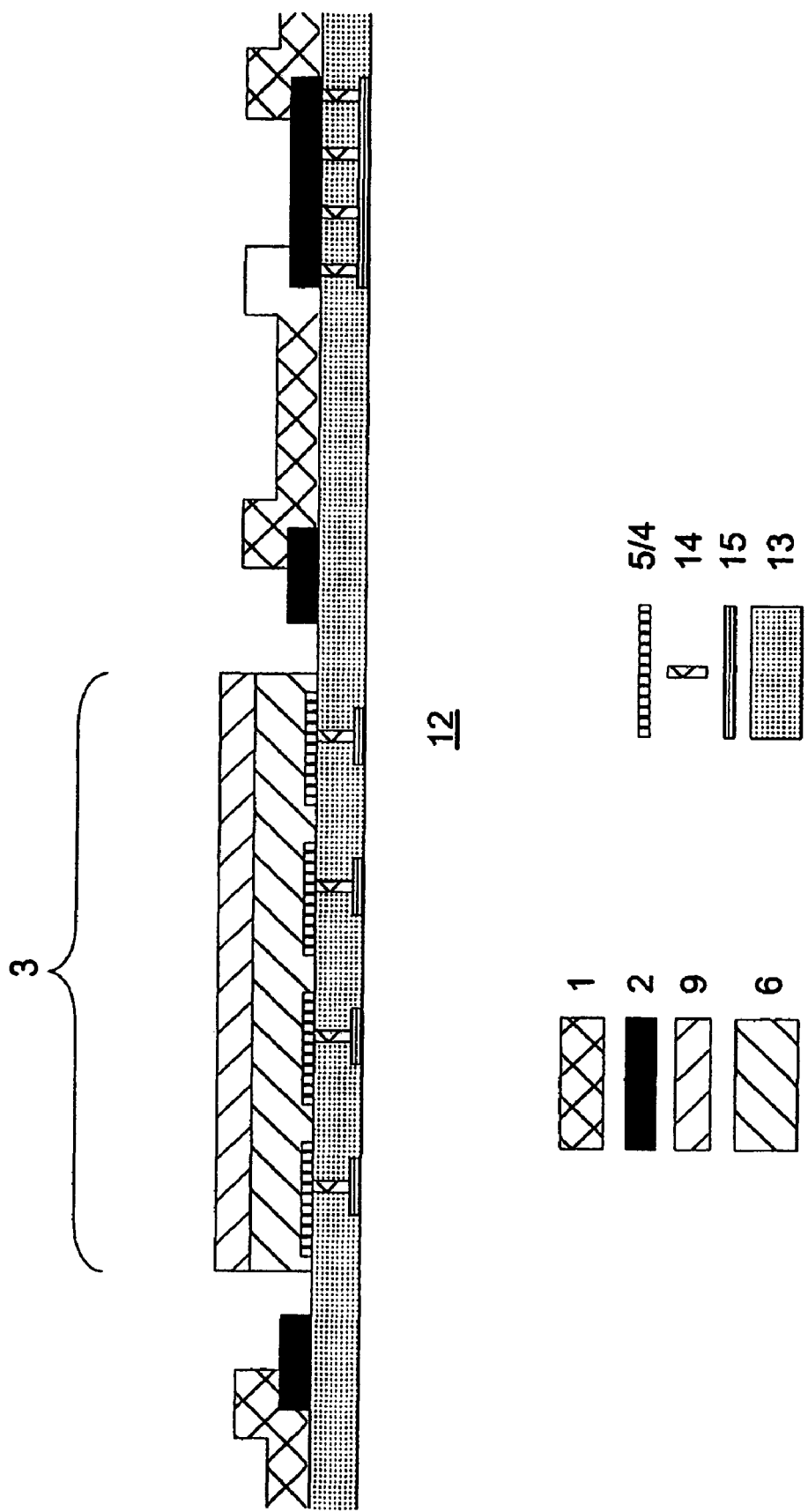
FIG. 5: The finished TFA image sensor based on the method according to the invention.

FIG. 5 presents a sketch of a complete image sensor realized in TFA technology.

The other figures illustrate the TFA image sensors with passivating transparent protective layer 10 (FIG. 6) or with the use of color filter layers 8 for passivation (FIG. 7).

Method for Producing a TFA Image Sensor and a TFA Image Sensor

Reference List

1 CMOS passivation
2 CMOS metallization
3 Photoactive region
4 Metal layer in pixel raster
5 Back electrode (metal 3)
6 Photodiode matrix
7 Light-screening layer
8 Color filter layer
8.1 Red
8.2 Green
8.3 Blue
9 Peripheral electronics
10 Passivating protective layer
11 Bond pad (metal 2)
12 ASIC circuit
13 Intermediate metal dielectric
14 Via
15 Contact (metal 1)
16 Contact (metal 1)

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. A method for producing a TFA image sensor in which a multilayer arrangement with a photodiode matrix is arranged on an ASIC circuit provided with electronic circuits for operating the TFA image sensor, for the pixel-wise conversion of electromagnetic radiation into an intensity-dependent photocurrent, wherein the pixels are connected to contacts of the underlying pixel electronics of the ASIC circuit, having a CMOS passivation layer in the photoactive region, the method comprising:

removing an uppermost CMOS metallization;
replacing the removed uppermost CMOS metallization with a metal layer for the formation of back electrodes, which is structured in the pixel raster; and
applying and structuring the photodiode matrix, wherein the photodiode matrix is designed as a pixel matrix.

2. A method according to claim 1, wherein that the metal layer structured in the pixel raster is fabricated by depositing chromium.

3. A method according to claim 1, wherein a passivating protective layer is applied to at least the photodiode matrix, wherein the bond pads are kept open or subsequently exposed.

4. A method according to claim 3, wherein the passivating protective layer covers the periphery of the photodiode matrix.

5. A method according to claim 3, wherein the passivating protective layer is applied in a low-temperature process.

6. A method according to claim 5, wherein the passivating protective layer is applied at a temperature of approx. 200° C.

7. A method according to claim 3, wherein the passivating protective layer comprises BCBs (cyclotene), parylene or another suitable polymeric transparent material.

8. A method according to claim 3, wherein a color filter layer with a passivating effect is applied at least on the photodiode matrix.

9. A method according to claim 8, wherein a mosaic-structured color filter layer is used.

10. A method according to claim 8, wherein several color filter layers are stacked one on top of the other.

11. The method according to claim 1, wherein the electronic circuits include at least one of pixel electronics, peripheral electronics and system electronics.

* * * * *